(12) United States Patent
Rasalingam et al.

(10) Patent No.: US 12,322,689 B2
(45) Date of Patent: Jun. 3, 2025

(54) SEMICONDUCTOR DEVICE PACKAGE WITH COMBINED CONTACTS

(71) Applicant: Western Digital Technologies, Inc., San Jose, CA (US)

(72) Inventors: Uthayarajan Rasalingam, Penang (MY); Roel Gabriel Hernando Taburnal, San Jose del Monte (PH)

(73) Assignee: Western Digital Technologies, Inc., San Jose, CA (US)

( * ) Notice: Subject to any disclaimer, the term of this patent is extended or adjusted under 35 U.S.C. 154(b) by 536 days.

(21) Appl. No.: 17/724,617

(22) Filed: Apr. 20, 2022

(65) Prior Publication Data

US 2023/0343690 A1    Oct. 26, 2023

(51) Int. Cl.
*H01L 23/00* (2006.01)
*H01L 23/31* (2006.01)
*H01L 23/498* (2006.01)

(52) U.S. Cl.
CPC .... *H01L 23/49838* (2013.01); *H01L 23/3128* (2013.01); *H01L 23/49816* (2013.01); *H01L 24/48* (2013.01); *H01L 2224/48227* (2013.01)

(58) Field of Classification Search
CPC ........... H01L 23/49838; H01L 23/3128; H01L 23/49816; H01L 24/48; H01L 2224/48227; H01L 23/50; H01L 23/49827; H01L 23/49811
See application file for complete search history.

(56) References Cited

U.S. PATENT DOCUMENTS

| 8,093,708 | B2 | 1/2012 | Lovskog | |
| 2009/0115050 | A1* | 5/2009 | Kasuya | H01L 23/3677 257/701 |

* cited by examiner

*Primary Examiner* — Elias Ullah
(74) *Attorney, Agent, or Firm* — Morgan, Lewis & Bockius LLP

(57) ABSTRACT

A semiconductor device package includes a substrate having a top and bottom surface and an electrical circuit. There is a semiconductor die electrically connected to the electrical circuit of the substrate. There are N adjacent first electrical contacts and N is an integer greater than 1. The N adjacent first electrical contacts are positioned within a first contact area on the bottom surface of the substrate. There is a second electrical contact that is associated with N independent common signals that are electrically connected at a single second electrical contact. The second electrical contact is positioned within a second contact area on the bottom surface of the substrate that is smaller than the first contact area. The second electrical contact reduces the total area required on the substrate for common signal contacts to allow for additional non-common signal contacts to be included in the semiconductor device package.

18 Claims, 8 Drawing Sheets

SEMICONDUCTOR DEVICE PACKAGE WITH COMBINED CONTACTS

BACKGROUND

The present disclosure generally relates to packaging for semiconductor devices (e.g., NAND flash devices) and assembly thereof and, more particularly, to a package for a semiconductor device having one or more common nodes combined into a single contact node.

Semiconductor device packages typically include one or more integrated circuit (IC) dies (e.g., NAND dies, application-specific integrated circuit (ASIC) dies, controller dies, etc.) and/or other semiconductor devices that are electrically coupled to a substrate by bond wires or solder balls that convey electrical signals between the dies and substrate. The substrate often includes a ball grid array comprised of solder balls arranged in an array according to a BGA pitch size (e.g., the minimum center-to-center distance between solder balls). Each solder ball allows various electrical signals including input/output (IO) signals, power signals, and ground signals to be transmitted to or from the semiconductor devices coupled to the substrate. In order to compensate for increasing functionality requirements, additional signals often need to be added which in turn requires additional solder balls to be added to the bottom of the substrate. However, due to size limitations, adding additional solder balls and signals is often expensive or may result in an increase in the overall size of the package, which can also be expensive.

SUMMARY

In one embodiment there is a semiconductor device package including a substrate including a top surface, a bottom surface and an electrical circuit, and a semiconductor die coupled to the top surface of the substrate and electrically coupled to the electrical circuit. The semiconductor device package further includes N adjacent first electrical contacts coupled to the bottom surface of the substrate and electrically coupled to the electrical circuit, wherein N is an integer greater than 1, the N adjacent electrical contacts positioned within a first contact area on the bottom surface of the substrate. The semiconductor device package further includes a second electrical contact coupled to the bottom surface of the substrate and electrically coupled to the electrical circuit, wherein the second electrical contact is associated with N independent common signals that are electrically connected at a single second electrical contact, the second electrical contact positioned within a second contact area on the bottom surface of the substrate that is smaller than the first contact area.

In some embodiments, the semiconductor device package further includes a third electrical contact coupled to the bottom surface of the substrate and electrically coupled to the electrical circuit, wherein the third electrical contact is associated with an electrical signal independent and distinct from any of the electrical signals of the N adjacent first electrical contacts and the N independent common signals of the second electrical contact, the second electrical contact and the third electrical contact positioned within a third contact area on the bottom surface of the substrate that is less than the first contact area. In some embodiments, the semiconductor device package further includes a fourth electrical contact coupled to the bottom surface of the substrate and electrically coupled to the electrical circuit, wherein the fourth electrical contact is associated with an electrical signal independent and distinct from any of the electrical signals of the N adjacent electrical contacts, the N independent common signals of the second electrical contact, and the electrical signal of the third electrical contact, wherein the second electrical contact, the third electrical contact, and the fourth electrical contact are positioned within a fourth contact area on the bottom surface of the substrate that is less than the first contact area.

In some embodiments, the second electrical contact is one of a power contact and ground contact, and the N adjacent first electrical contacts are each input/output contacts configured to transmit electrical signals to and from the semiconductor die. In some embodiments, the semiconductor device package further includes one or more first contact pads electrically connecting the N adjacent first electrical contacts to the electrical circuit of the substrate, and one or more second contact pads electrically connecting the second electrical contact to the electrical circuit of the substrate, and the electrical circuit includes at least one first trace electrically connected to each of the one or more first contact pads, and at least one second trace electrically connected to each contact pad of the one or more second contact pads.

In some embodiments, the one or more second contact pads includes one of a power contact pad configured to provide power to the semiconductor die and a ground contact pad in electrical communication with the semiconductor die. In some embodiments, the second electrical contact has a height that is equal to a height of the electrical contacts included in the N adjacent first electrical contacts. In some embodiments, the N adjacent first electrical contacts is N adjacent solder balls each comprised of a first volume of solder material, and wherein the second electrical contact is comprised of a second volume of solder material that is greater than the first volume of solder material. In some embodiments, the second volume of solder material is at least twice the first volume of solder material.

In another embodiment there is a semiconductor device package including a substrate means for providing electrical communication to one or more electrical components coupled to the substrate means, and one or more storage means for providing a first storage amount and connected to a top surface of the substrate means. The semiconductor device package further includes N adjacent first electrical contact means each for transmitting to and receiving from the one or more storage means a plurality of electrical signals, where N is an integer greater than 1 and the N adjacent first electrical contact means are connected to a bottom surface of the substrate means, the N adjacent first electrical contact means are positioned within a first contact area on the bottom surface of the substrate means. The semiconductor device package further includes a second electrical contact means for transmitting to and receiving from the one or more storage means a second signal, wherein the second signal is associated with N independent common signals electrically connected at a single second electrical contact means, the second electrical contact means connected to the bottom surface of the substrate means, the second electrical contact means positioned within a second contact area on the bottom surface of the substrate means that is smaller than the first contact area.

In some embodiments, each electrical contact means of the N adjacent first electrical contact means includes a first volume of solder material, and wherein the second electrical contact means includes a second volume of solder material that is at least twice the first volume of solder material. In some embodiments, the semiconductor device package further includes a third electrical contact means for transmitting to and receiving from the one or more storage means a third signal, the third electrical contact means coupled to the bottom surface of the substrate means, wherein the third signal is independent and distinct from any of the electrical signals of the N adjacent first electrical contact means and the N independent common signals of the second electrical contact means, the second electrical contact means and the third electrical contact means positioned within a third contact area on the bottom surface of the substrate means that is smaller than the first contact area.

In some embodiments, the second electrical contact means has a height that is equal to the height of the electrical contact means included in the N adjacent first electrical contact means. In some embodiments, the second electrical contact means is one of a power contact means and a ground contact means, and the N adjacent first contact means are each input/output contact means for transmitting input/output signals to and from the one or more storage means. In another embodiment, there is a semiconductor device package including a substrate including a top surface and a bottom surface and an electrical circuit, a semiconductor die attached to the top surface of the substrate and electrically coupled to the electrical circuit, an array of first electrical contacts formed on the bottom surface of the substrate and electrically coupled to the electrical circuit, wherein the first electrical contacts transmit and receive signals to and from the semiconductor die and wherein the first electrical contacts have a first size, and a first set of two or more second electrical contacts formed on the bottom surface of the substrate and electrically coupled to the electrical circuit, wherein the first set of two or more second electrical contacts are adjacent to each other and disposed within the array of first electrical contacts. Each of the second electrical contacts have a second size that is larger than the first size, and wherein each of the second electrical contacts provide one of power and ground to the semiconductor die In some embodiments, the semiconductor device package further includes a second set of two or more second electrical contacts formed on the bottom surface of the substrate and electrically coupled to the electrical circuit, wherein the second set of two or more second electrical contacts are adjacent to each other and disposed within the array of first electrical contacts, wherein the second electrical contacts of the second set of two or more second electrical contacts have a third size that is larger than the first size, and wherein the second electrical contacts of the second set of two or more second electrical contacts provide the other one of power and ground to the semiconductor die.

In some embodiments, the semiconductor die is electrically coupled to the electrical circuit by way of bond wires. In some embodiments, the first electrical contacts are solder balls each comprised of a first volume of solder material, and wherein the second electrical contacts are comprised of a second volume of solder material that is greater than the first volume of solder material. In some embodiments, the second volume of solder material is at least twice the first volume of solder material. In some embodiments, the second electrical contacts have a height that is equal to the height of the first electrical contacts.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments, which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the Drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
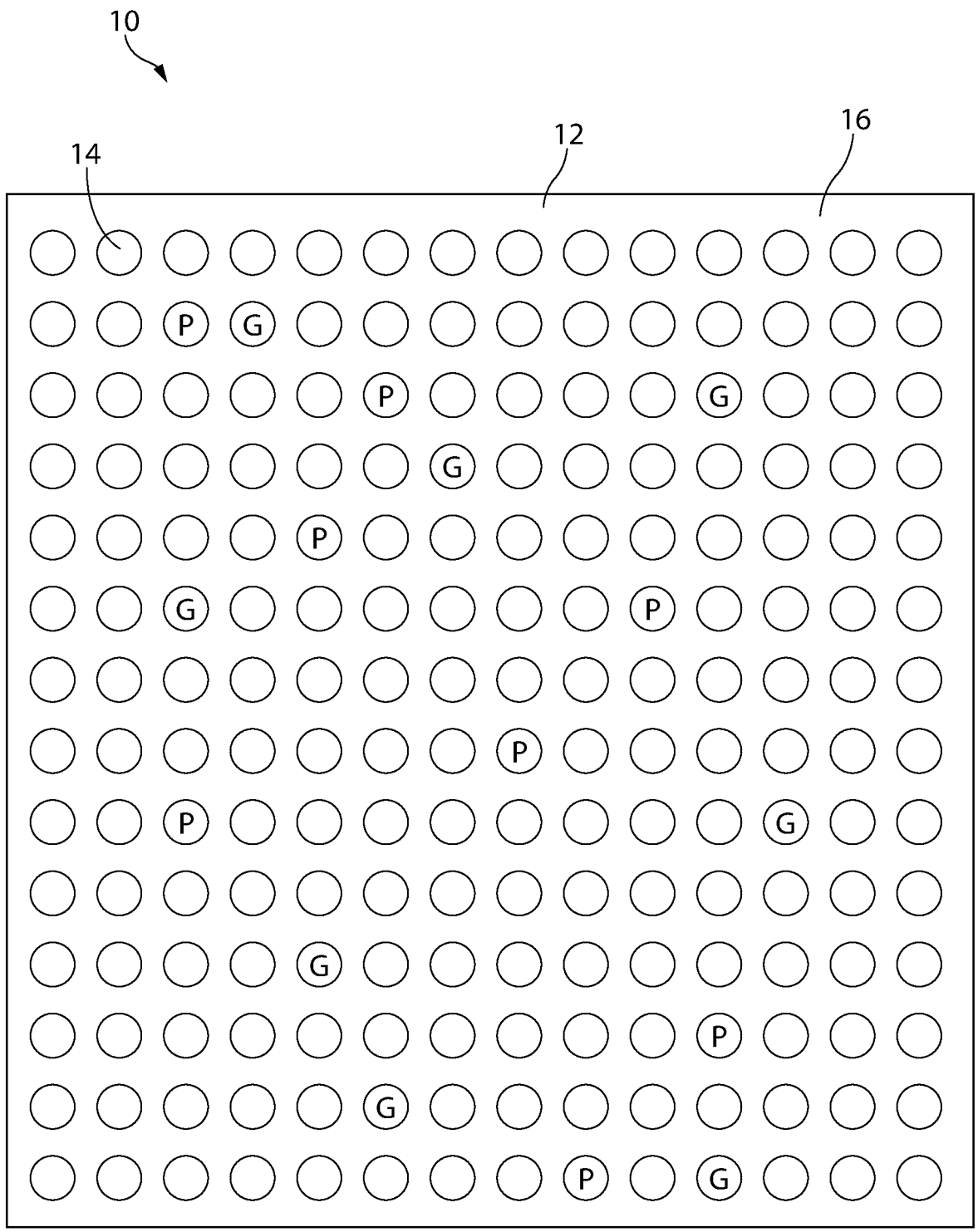
FIG. 1 is a bottom elevational view of a conventional semiconductor device package.

Referring to FIG. 1, there is shown a bottom elevational view of a conventional semiconductor device package, generally designated 10, having one or more electrical contacts coupled thereto. The semiconductor device package 10 includes a substrate 12 having a plurality of electrical contacts 14 coupled to a bottom planar surface 16 of the substrate 12. In the conventional semiconductor device package 10, the electrical contacts 14 include input/output contacts, power contacts, and ground contacts. The electrical contacts 14 form a ball grid array (BGA) where each electrical contact 14 is generally equally spaced from the adjacent electrical contacts. Put another way, the electrical contacts 14 have a generally uniform pitch. The electrical contacts 14 route signals to and from devices coupled to the substrate 12 (e.g., semiconductor dies) and allow the semiconductor device package 10 to be coupled to an external device, such as a printed circuit board (PCB). In FIG. 1, the power contacts are labeled as "P" and the ground contacts are labeled as "G". The remaining contacts illustrated in FIG. 1 that are not labeled by the letters "P" or "G" represent the input/output contacts. As can be seen, in the conventional semiconductor device package 10, the power and ground contacts are scattered throughout the BGA. For example, the power contacts are not clustered next to one another and the same is true for the ground contacts. Instead, the power and ground contacts are spread throughout the BGA in a non-uniform manner. As such, there are multiple power and ground nodes spread throughout the bottom surface of the substrate 12.

The embodiments of the present disclosure, as discussed with reference to FIGS. 2-10, provide semiconductor device packages having common contacts grouped and/or clustered together. Common contacts may refer to electrical contacts that route common signals to and from the semiconductor device packages discussed herein. For example, power contacts and/or ground contacts may be considered common contacts and the input/output contacts may not. By grouping and/or clustering the common contacts together, additional contacts may be included in the semiconductor device packages without requiring that the pitch be reduced and/or that the package dimensions be increased.

Figure 2:
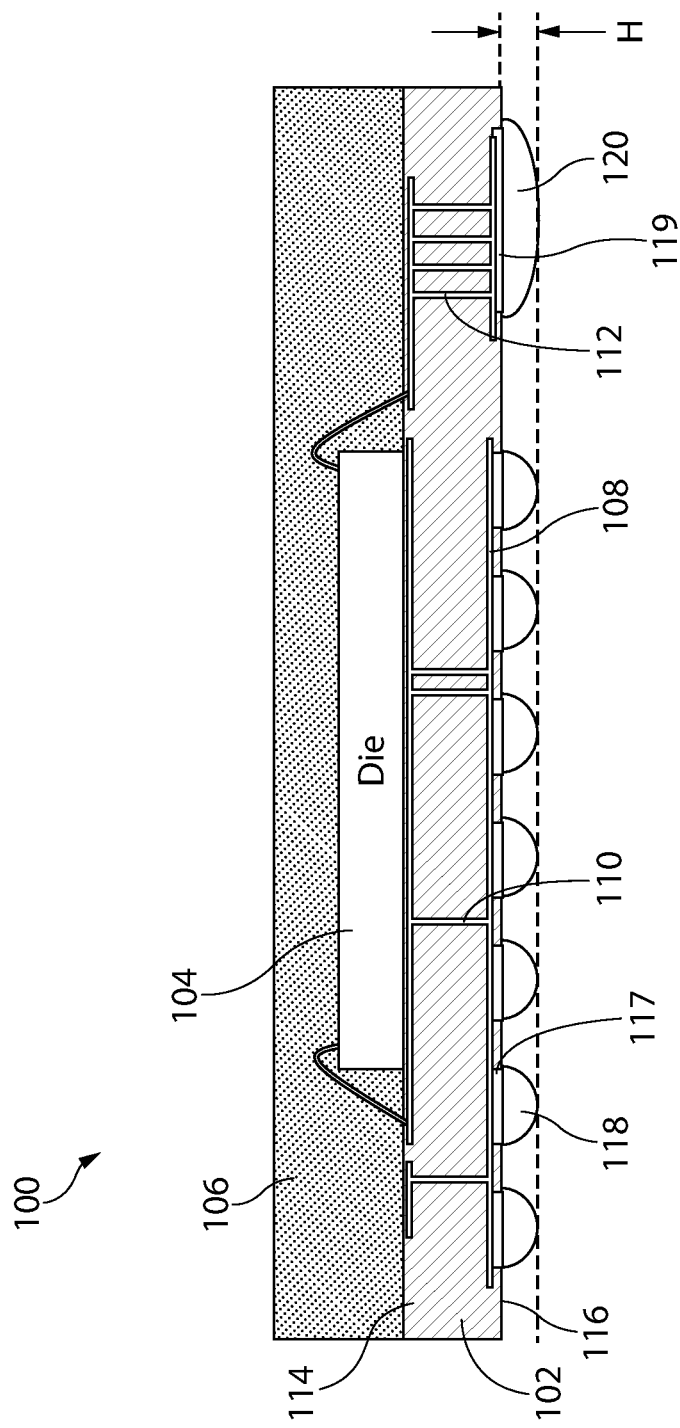
FIG. 2 is a cross-sectional side view of a semiconductor device package with combined contacts in accordance with an exemplary embodiment of the present disclosure.
Figure 3:
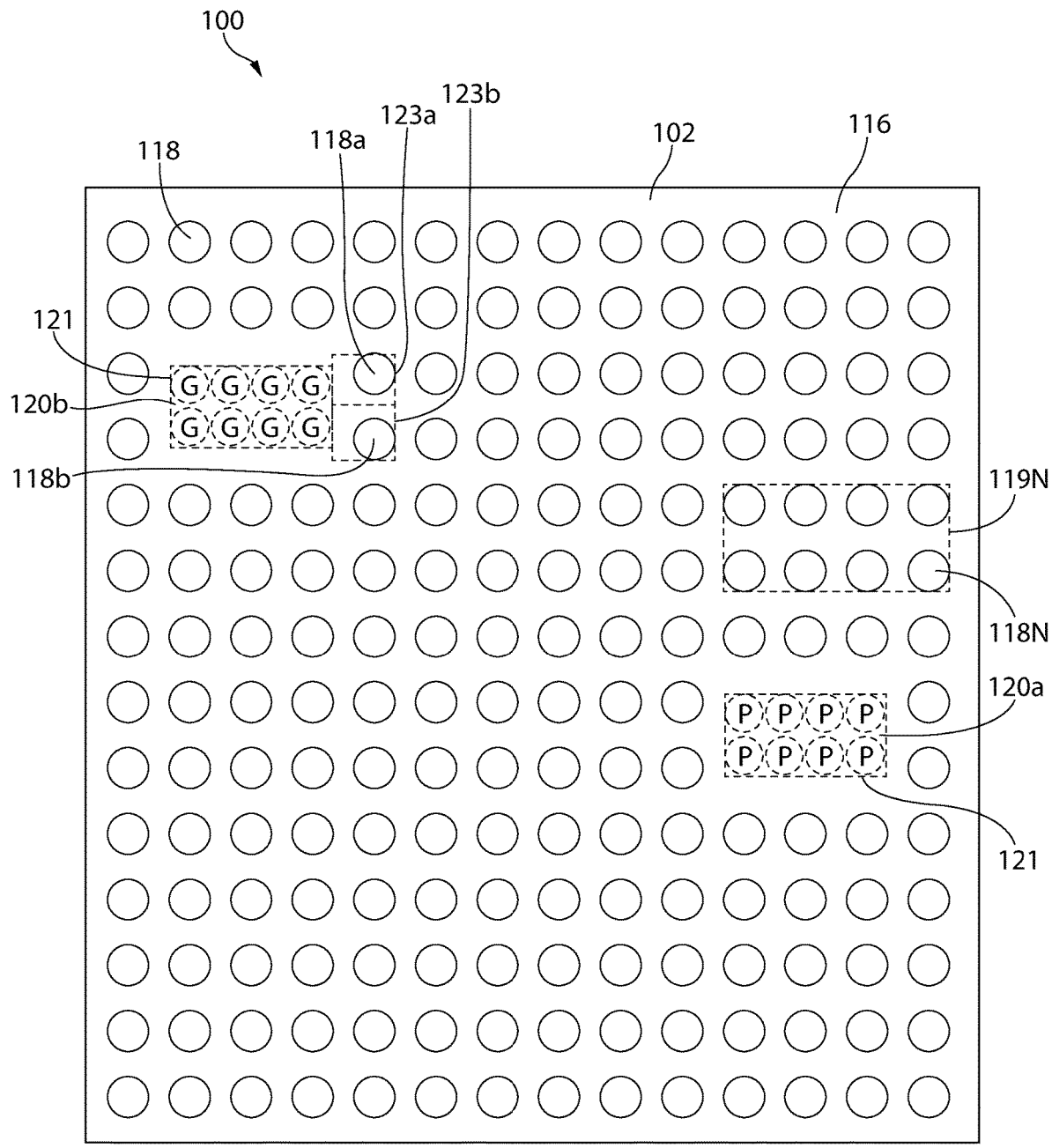
FIG. 3 is a bottom elevational view of the semiconductor device package of FIG. 2.
Figure 4:
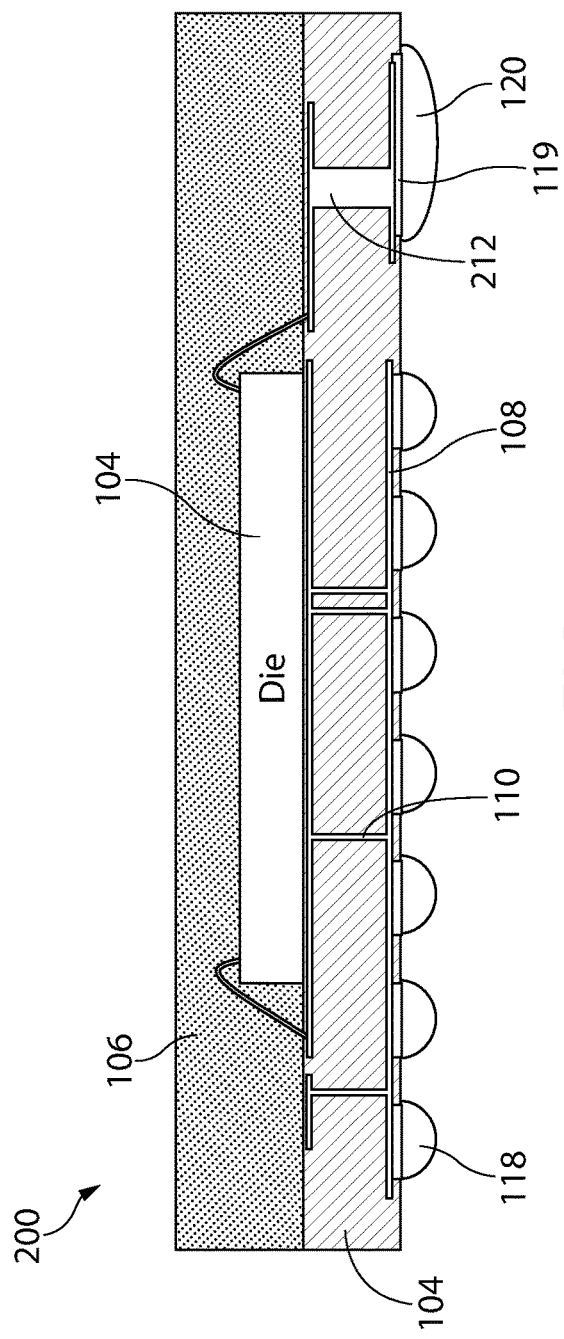
FIG. 4 is a cross-sectional side view of a semiconductor device package with combined contacts in accordance with another exemplary embodiment of the present disclosure.
Figure 5:
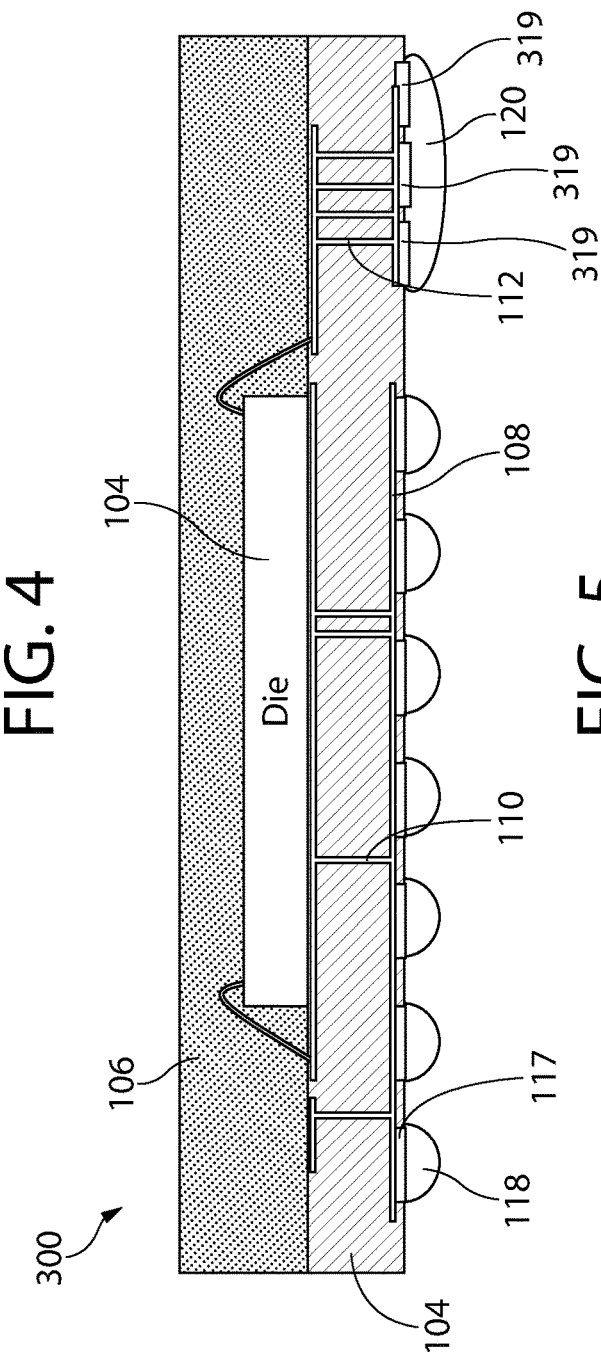
FIG. 5 is a cross-sectional side view of a semiconductor device package with combined contacts in accordance with another exemplary embodiment of the present disclosure.
Figure 6:
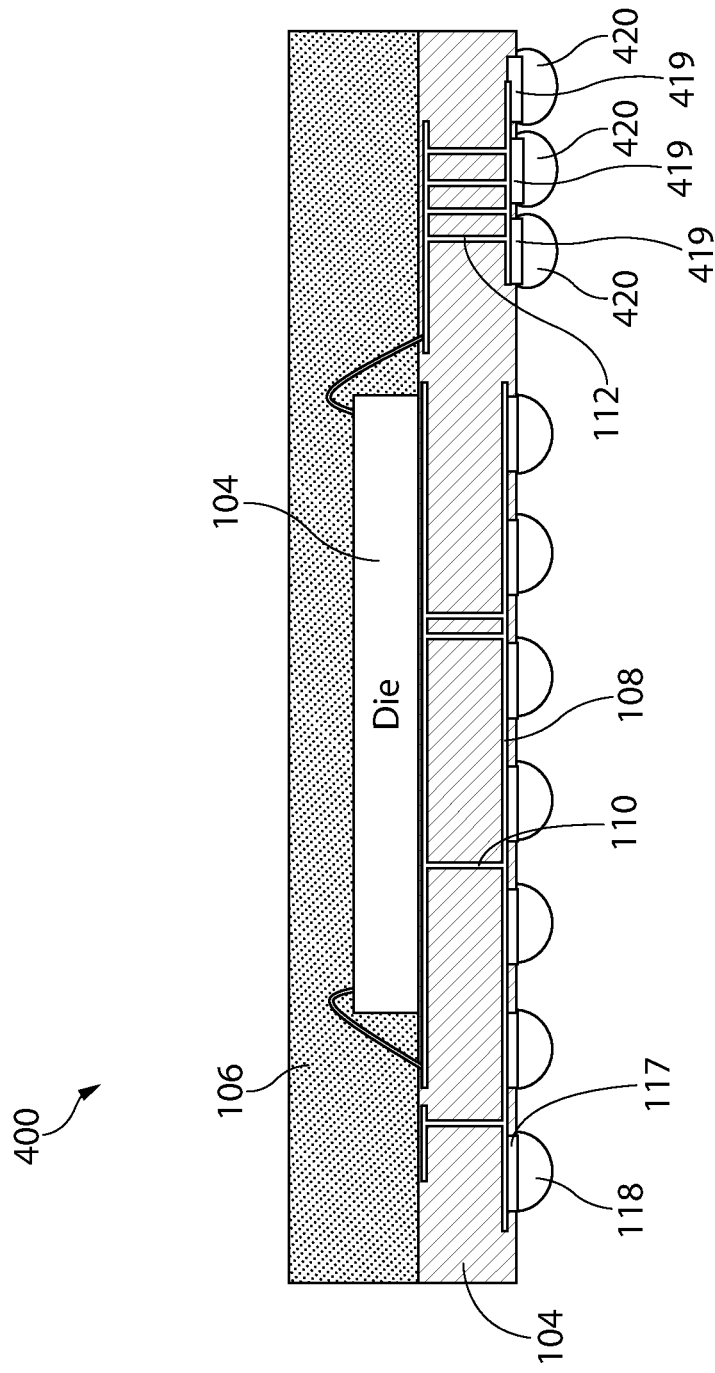
FIG. 6 is a cross-sectional side view of a semiconductor device package with combined contacts in accordance with another exemplary embodiment of the present disclosure.
Figure 7:
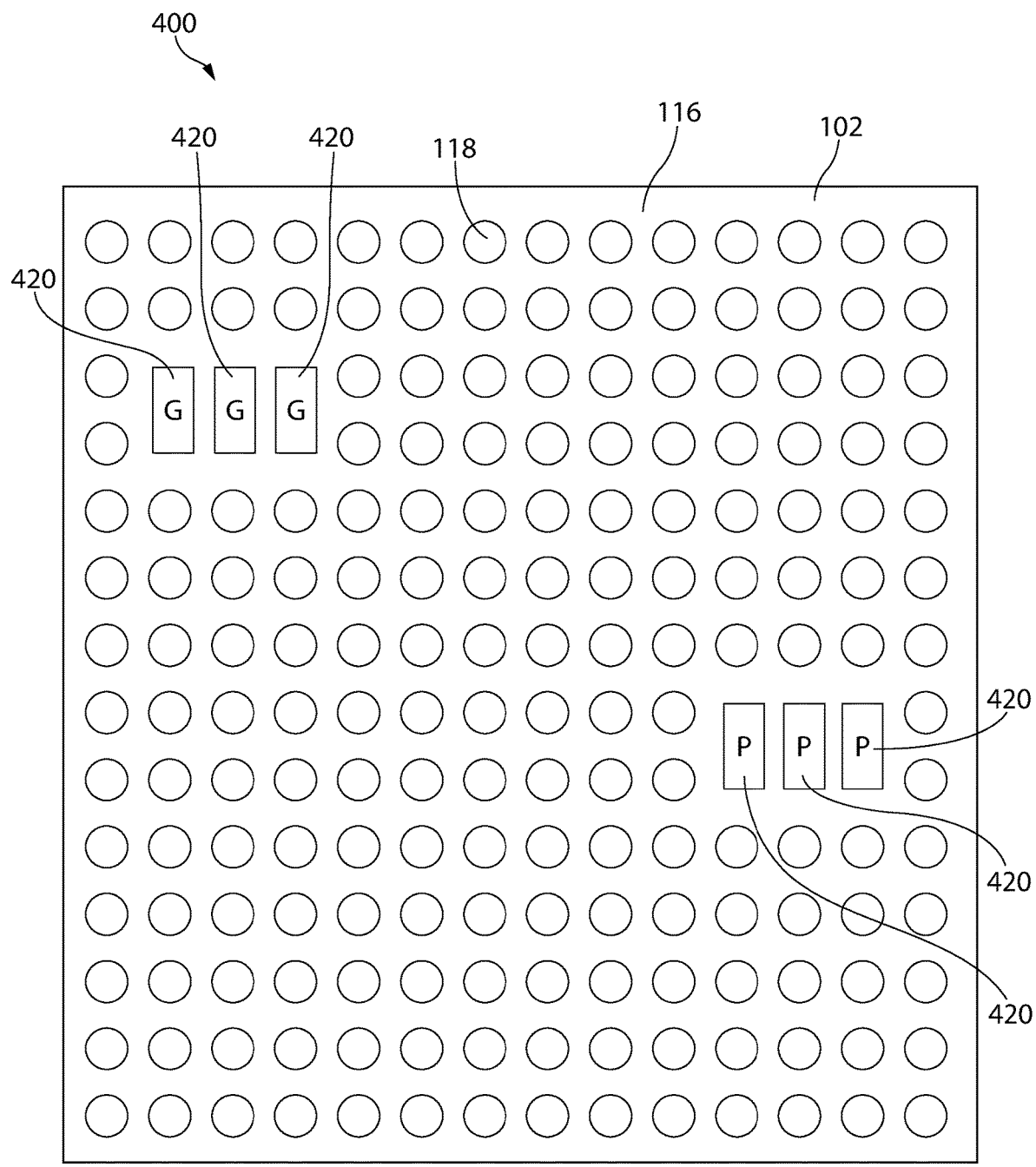
FIG. 7 is a bottom elevational view of the semiconductor device package of FIG. 6.

Referring to FIGS. 2-3, there is shown a semiconductor device package, generally designated 100, in accordance with an exemplary embodiment of the present disclosure. The semiconductor device package 100 may include a substrate 102, a semiconductor die 104 coupled to the substrate 102, and an encapsulant 106 at least partially covering the semiconductor die 104. The semiconductor device package 100 may be any type of semiconductor device, such as a system-in-package (SiP). In one nonlimiting example, the semiconductor device package is a storage device (e.g., a secure digital (SD) card or a MultiMediaCard (MMC)) and the semiconductor die 104 is a NAND memory die. In some embodiments, the semiconductor device package 100 may be any type of semiconductor device, such as an SiP, or package-on-package (PoP). Although not shown, it will be understood that multiple semiconductor dies may be included in the semiconductor device package 100. For example, and without limiting the generality of the foregoing sentence, there may be between one to thirty-two semiconductor dies included in the semiconductor device package 100. In some embodiments, the semiconductor die 104 may be, for example, a controller die, an application-specific integrated circuit (ASIC) die, or other integrated circuit (IC) die.

In some embodiments, the substrate 102 may be a mechanical base support for the semiconductor device packages 100 and an electrical interface (or electrical circuit) that provides access to the semiconductor die 104 housed within the semiconductor device package 100. For example, the substrate 102 may include an electrical circuit 108 including plurality of metal layers and/or traces disposed within the substrate 102, including one or more layers for routing signals such as, but not limited to, input/output signals, power signals, and ground signals using conductive (e.g., copper) traces. In some embodiments, the electrical circuit 108 includes one or more first traces 110 and one or more second traces 112 configured to route signals to and from the semiconductor die 104. The first traces 110 may route input/output signals to and from the semiconductor die 104 and the one or more second traces 112 may route common signals (e.g., power and ground signals) to and from the semiconductor die 104.

The substrate 102 may include a top planar surface 114 and a bottom planar surface 116. The top planar surface 114 may be opposite the bottom planar surface 116 and may be substantially parallel with the bottom planar surface 116. In some embodiments, the semiconductor die 104 is coupled to the top planar surface 114 of the substrate 102. The semiconductor die 104 may be in electrical communication with the electrical circuit 108 of the substrate 102. In some embodiments, at least a portion of the semiconductor die 104 is encapsulated by the encapsulant 106. The encapsulant 106 may include, for example, an epoxy molding compound (EMC) or another encapsulant material known in the art.

The semiconductor device package 100 may include electrical contacts configured to couple the semiconductor device package 100 to other components (e.g., another substrate, a PCB, another semiconductor device package) so as to exchange signals. In some embodiments, there is a first plurality of electrical contacts 118 and one or more second electrical contacts 120 each coupled to the bottom planar surface 116 of the substrate 102. The first plurality of electrical contacts 118 may each be generally uniform in size and shape. In some embodiments, each first electrical contact 118 may be spaced from adjacent first electrical contacts 118 by a minimum distance (e.g., the pitch). In some embodiments, the first electrical contacts 118 have a generally uniform pitch.

In some embodiments, the first electrical contacts 118 are comprised of a first volume of material (e.g., solder material) that is generally the same for each first electrical contact 118. In some embodiments, each of the first electrical contacts are generally the same size. In some embodiments, the first electrical contacts 118 may be solder balls configured to couple to contact pads of another component (e.g., a PCB, second substrate). Although the first electrical contacts 118 are illustrated as solder balls in FIG. 2, the first electrical contacts 118 may include, but are not limited to, bumps, solder balls, pins, and pads. The first volume of material used for each first electrical contact 118 may be substantially the same throughout the semiconductor device package 100. The solder material used may be any solder material known to those skilled in the art.

In some embodiments, each first electrical contact 118 may be configured to route input/output signals to and from the semiconductor device package 100. For example, each first electrical contact 118 may be in electrical communication with the electrical circuit 108 of the substrate 102 such that input/output signals may be transmitted from one or more of the first electrical contacts 118, through the electrical circuit 108, to the semiconductor die 104 and vice versa. In some embodiments, each first electrical contact 118 is in electrical communication with the first traces 110 such that input/output signals may be routed to and from the semiconductor die 104 via the first electrical contacts 118. In some embodiments, the electrical circuit 108 of the substrate 102 includes a number of first traces 110 that is equal to the number of first electrical contacts 118. The first electrical contacts 118 may represent input/output nodes on the semiconductor device package 100. In some embodiments, there is a first plurality of conductive pads 117 that couple the first electrical contacts 118 to the substrate 102. For example, the conductive pads 117 may be connected to the bottom planar surface 116 of the substrate 102 and electrically connected to the electrical circuit 108. The first electrical contacts 118 may be connected to a corresponding first conductive pad 117 such that, when connected, the first electrical contacts 118 are in electrical communication with the electrical circuit 108.

In some embodiments, a number N (where N is an integer greater than one) of adjacent first electrical contacts 118N may be positioned within a first contact area 119N on the bottom planar surface 116 of the substrate 102. The N adjacent first electrical contacts 118N may be generally the same as first contacts 118, or, put another way, the plurality of first contacts 118 includes a number N of adjacent first electrical contacts 118N. In some embodiments, each N adjacent first electrical contact 118N is associated with a single electrical signal. For example, each N adjacent first electrical contact 118N may correspond to a single electrical signal such as, but not limited to, an input/output signal that is separate and distinct from each other input/output signal. In FIG. 3, the first contact area 119N is illustrated by the broken line surrounding eight (e.g., N=8) adjacent first electrical contacts 118N. The first contact area 119N may be defined by the minimum surface area at the bottom planar surface 116 of the substrate 102 within which each of the N adjacent first electrical contacts 118N is positioned and the pitch between each said N adjacent first electrical contact 118N. Put another way, the first contact area 119N is defined by the footprint of N adjacent first electrical contacts 118N on the bottom planar surface 116 of the substrate 102. A contact area may generally refer to the minimal surface area on a surface of the substrate 102 (e.g., the bottom planar surface 116) required by first electrical contacts 118 and/or second electrical contacts 120, in order for said electrical contacts 118, 120 to transmit electrical signals without interference or shorts. Although in FIG. 3, the first contact area 119N is defined by eight adjacent first electrical contacts 118N oriented in a 2×4 array layout, it will be understood that the first contact surface area 119N may be defined by a different number of first adjacent electrical contacts 118N oriented in a different layout (e.g., a 1×8 array layout, a 4×2 array layout). It will be understood that the adjacent first electrical contacts 118N are oriented within an array that is the subset of the array defined by the plurality of first contacts 118. As such, the second electrical contacts may be disposed within the array defined by the plurality of first contacts 118.

In some embodiments, the number N of N adjacent first electrical contacts 118N corresponds to the number of independent common signals electrically connected at one of the second electrical contacts 120. For example, the second electrical contacts 120 may connect a number N of independent common signals (e.g., power signals, ground signals) into a single second electrical contact. The number N being the same as the number of N adjacent first electrical contacts 118N. For example, and as illustrated in FIG. 3, the second electrical contact 120a electrically connects eight independent common power signals into a single second electrical contact 120a and the number N of adjacent first electrical contacts 118N is also eight (e.g., N=8). The independent common signals electrically connected at the second electrical contacts 120 may refer to common electrical signals that are independent of one another and that are each electrically connected to a second electrical contact 120. In some embodiments, the independent common signals are grouped at a second electrical contact 120. In FIG. 3, the circular broken lines within the second electrical contacts 120a, 120b that are marked "P" and "G" respectively, may be for illustrative purposes only and may not, for example, represent contact pads positioned between the bottom planar surface 116 of the substrate 102 and the second electrical contact pads 120a, 120b. Instead, the circular broken lines are intended to illustrate the concept of N common signals grouped into a single second electrical contact 120a, 120b.

In some embodiments, the second electrical contacts 120 may be coupled to the bottom planar surface 116 of the substrate 102 such that the second electrical contacts 120 are in electrical communication with the electrical circuit 108. As discussed above, the second electrical contacts 120 may electrically connect independent common signals into a single node. For example, the second electrical contacts may electrically connect all power or ground signals into a single node. As shown in FIG. 1, the power and ground contacts of conventional semiconductor device packages 10 are dispersed throughout the package 10 into multiple different contacts or nodes. In the semiconductor device package 100 of the present disclosure, each second electrical contact 120 includes an electrical connection of all of the power signals or ground signals into a single contact or node. For example, the second electrical contact 120 illustrated in FIG. 2 is a single contact that may route one of the power signal or ground signal to and from the semiconductor device package 100. As such, the first plurality of contacts 118 may not route power or ground signals to and from the semiconductor device package 100.

By providing one or more second electrical contacts 120 that electrically connect independent common signals into a single contact the number of contacts for non-common signals may be increased. For example, in the conventional semiconductor device package 10 shown in FIG. 1, there are sixteen common signal contacts that route common signals (e.g., eight power contacts P and eight ground contacts G) the sixteen common signal contacts are positioned within the BGA defined by the electrical contacts 14 according to the pitch. In the semiconductor device package 100 the second electrical contacts 120 electrically connects each of the independent common signals into a single contact thereby allowing the equivalent of, for example, the eight power contacts or eight ground contacts of the conventional package 10, to be positioned more closely together.

In this manner, one or more additional electrical contacts (e.g., electrical contacts for routing input/output signals) may be included in the semiconductor device package 100 when compared to a conventional package (e.g., package 10). The comparison may be better understood when referencing FIGS. 1 and 3 respectively wherein in FIG. 1, the conventional semiconductor device package includes eight power contacts spread throughout the BGA and in FIG. 3, the semiconductor device package 100 includes a second electrical contact 120a that routes power to the semiconductor device package 100. In FIG. 3, the second electrical contact 120a for routing common power signals (illustrated as contact "P") encompasses an area on the bottom surface 116 of substrate 102 that is less than the first contact area 119N required for the same number N of adjacent first electrical contacts 118N. The second electrical contact 120 may provide signal routing functionality equivalent to the eight separate power contacts in the conventional package 10.

In some embodiments, each of the second electrical contacts 120 may be positioned within second contact area 121 on the bottom planar surface 116 of the substrate 102 that is less than the first contact area 119N of the N adjacent first electrical contact 118N. In this manner, a number of N independent common signals (e.g., eight power signals, eight ground signals) may be electrically connected within the second contact area 121 that is less than the first contact surface area 119N containing the same number N of uncommon (e.g., input/output) signals. In FIG. 3, the second contact area 121 is illustrated as a broken line surrounding the periphery of a corresponding second electrical contact 120a, 120b. As such, the second electrical contacts 120 may have a smaller footprint on the substrate 102 than the N adjacent first electrical contacts 118N, as illustrated in FIG. 3.

In some embodiments, by providing the second electrical contacts 120 within a second contact area 121 there may be an additional area on the bottom planar surface 116 of the substrate 102, proximate the second electrical contact 120, where one or more additional electrical contacts may be positioned. For example, there may be a third electrical contact 118a and/or a fourth electrical contact 118b positioned adjacent a second electrical contact 120. The third electrical contact 118a may be generally the same as the first electrical contacts 118. For example, the third electrical contact 118a may be associated with an electrical signal (e.g., an input/output signal) that is independent of and distinct from any of the electrical signals of the N adjacent first electrical contacts 118N and the N independent common signals of the second electrical contact 120. The third electrical contact 118a may be positioned within a contact area 123a on the bottom planar surface 116 of the substrate 102. In this manner, the second electrical contact 120b and third electrical contact 118a may positioned within a third contact area at the bottom planar surface 116 of the substrate 102 that is defined by combining the second contact area 121 and contact area 123a. The third contact area may be less than the first contact area 119N.

Similar to the third electrical contact 118a, the fourth electrical contact 118b may be generally the same as the first electrical contacts 118. For example, the fourth electrical contact 118b may be associated with an electrical signal (e.g., an input/output signal) that is independent of and distinct from any of the electrical signals of the N adjacent first electrical contacts 118N, the N independent common signals of the second electrical contact 120, and the electrical signal of the third electrical contact 118a. The fourth electrical contact 118b may be positioned within a contact area 123b on the bottom planar surface 116 of the substrate 102. In this manner, the second electrical contact 120b, third electrical contact 118a, and fourth electrical contact 118b may positioned within a fourth contact area at the bottom planar surface 116 of the substrate 102 that is defined by combining the second contact area 121 with contact area 123a and contact area 123b. The fourth contact area may be less than or equal to the first contact area 119N. It will be understood that the third and fourth electrical contacts 118a, 118b are positioned proximate the second electrical contact 120b, however the electrical contacts 118 positioned proximate the second electrical contact 102a may be described in a similar manner. For example, the two first electrical contacts 118 on either the left or right side of the second electrical contact 120a may be described in a similar manner as discussed with reference to the third and fourth electrical contacts 118a, 118b.

As mentioned previously, the second electrical contact 120 may provide power or ground routing capabilities generally equivalent to the eight power contacts or eight ground contacts of the conventional package 10 within a smaller space. For example, if the second electrical contact 120b were replaced with eight individual electrical contacts, having generally the same size as contacts 118 and spaced from one another as defined by the pitch of the electrical contacts 118, the third and fourth electrical contacts 118a, 118b may need to be replaced with ground contacts in order to accommodate the eight ground contacts within the BGA. However, the second electrical contact 120b routes ground signals to the semiconductor device package 100 and encompasses a surface area (e.g., the second contact area 121) on substrate 102 that is less than what would be required with individual electrical contacts. Therefore, the semiconductor device package 100 may allow for a greater number of electrical contacts for routing uncommon signals (e.g., first, second and third electrical contacts 118, 118a, 118b for routing input/output signals) to be included therewith, when compared to the conventional package 10. In some embodiments, the second electrical contacts 120 allow for more than one additional electrical contact to be included in the semiconductor device package 100 when compared to the conventional package 10. For example, the semiconductor device package 100 as shown in FIG. 3 includes four additional electrical contacts 118, 118a, 118b (e.g., input/output contacts) when compared to the conventional semiconductor device package 10 while providing generally the same power and ground signal routing capabilities.

The four additional contacts may be the second and third electrical contacts 118a, 118b proximate the second electrical contact 120b and two of the first electrical contacts 118 proximate the second electrical contact 120a. The second electrical contact 120b (illustrated as contact "G") may be configured to route ground signals to and from the semiconductor device package 100. The second electrical contact 120b may be generally the same as second electrical contact 120a except that it is configured to route ground signals to and from the semiconductor device package 100.

The space required for the first electrical contacts 118 may refer to the surface area on the substrate 102 required to receive a number of the respective first electrical contacts 118 having a predetermined size and pitch. For example, the space required for six of the first contacts 118 may be the surface area on the bottom planar surface 116 of the substrate 102 required to couple a 2×3 array of first contacts 118 thereto at a predetermined pitch. It will be understood that the above example is intended to facilitate better understanding of aspects of the present disclosure relative to conventional semiconductor device packages and that the specific number of electrical contacts compared above are for illustrative purposes only. In the above example, a single second electrical contact 120 is positioned within an area of the substrate 102 sized to receive six of first electrical contacts 118 provides power routing capabilities as compared with the eight power contacts of the conventional semiconductor device package 10 of FIG. 1. However, it will be understood by those skilled in the art that the second electrical contacts 120 may allow for more than four additional electrical contacts (e.g., input/output contacts) to be included in a semiconductor device package, when compared to a conventional package, without requiring reductions in pitch and/or an increase in size of the semiconductor device package.

Referring back to FIGS. 2-3 and as discussed above, the second electrical contacts 120 may be configured to electrically connect independent common signals into a single electrical contact. For example, the semiconductor device package 100 includes second electrical contact 120a for electrically connecting common power signals into a single contact (e.g., contact 120a) and second electrical contact 120b for electrically connecting common ground signals into a single contact (e.g., contact 120b). In this manner, the semiconductor device package 100 may allow for additional electrical contacts (e.g., first electrical contacts 118 for input/output signals) to be included in the package 100 without requiring that the pitch be decreased and/or the size of the package 100 be increased.

In some embodiments, each of the second electrical contacts 120 is larger than any one first electrical contact 118. As mentioned above, the each of the first electrical contacts 118 may be comprised of a first volume of material. In some embodiments, the second electrical contacts 120 may be comprised volume of material (e.g., solder material) that is greater than the first volume of solder material. In some embodiments, the second volume of material is at least twice, at least four times, at least six times, or at least eight times greater than the first volume of material.

It will be understood that the size, orientation, and/or placement of the second electrical contacts 120 may be different than what is shown in FIG. 3. In some embodiments, one or more of the second electrical contacts 120 are surrounded on at least two sides by first electrical contacts 118. For example, in FIG. 3, second electrical contacts 120a, 120b are surrounded on all four sides by first electrical contacts 118. However, in other embodiments, the size, placement, and/or orientation of one or more of second electrical contacts 120b may be such that they are surrounded on two or three sides respectively. For example, in FIG. 3, if second electrical contact 120b were repositioned to be in the upper left corner of the substrate 102, it would be surrounded on two sides by first electrical contacts 118.

In some embodiments, the semiconductor device package 100 includes one or more second contact pads 119 configured to couple the second electrical contacts 120 to the substrate 102. The second contact pads 119 may be coupled to the bottom planar surface 116 of the substrate 102. In some embodiments, the second contact pads 119 are electrically connected to the electrical circuit 108. In this manner, the second electrical contact pads 119 may electrically connect the one or more second electrical contacts 120 to the electrical circuit 108 of the substrate 102. In some embodiments, there may be one second contact pad 119 for each second electrical contact 120. For example, the semiconductor device package 100 may include two second electrical contacts 120 and two second contact pads 119.

In some embodiments, the one or more second contact pads 119 are in electrical communication with the one or more second traces 112. For example, the one or more second contact pads 119 may be electrically connected to the one or more second traces 112. In some embodiments, the one or more second traces 112 includes at least two traces 112 electrically connected to a second contact pad 119. In some embodiments, each of the traces 112 corresponds to a common signal trace that is grouped at the second contact pad 119 and/or second electrical contact 120. For example, each of traces 112 may be configured to transmit power or ground signals to and from the semiconductor die 104. There may be at least four of second traces 112 each electrically connected to the second contact pad 119 and in electrical communication with the semiconductor die 104. In this manner, a power or ground signal may be routed by a second electrical contact 120, through the corresponding second contact pad 119, through each of the second traces 112 and to the semiconductor die 104. In some embodiments, there are between two to twelve second traces 112 electrically connected to each second contact pad 120.

In some embodiments, the height of the first electrical contacts 118 and second electrical contacts 120 is generally the same. For example, the first electrical contacts 118 protrude from the bottom planar surface 116 of the substrate 102 by a height H. The second electrical contacts 120 may also protrude from the bottom planar surface 116 of the substrate 102 by the height H. In this manner, by providing first and second electrical contacts 118, 120 having generally the same height, the semiconductor device package 100 may be easily coupled to an external device (e.g., a second substrate, a PCB). Although the second electrical contact 120 is illustrated as being curved, the second electrical contact 120 may have a generally planar bottom surface that protrudes from the bottom surface 116 of the substrate 102. For example, the cross-sectional side view of the second electrical contact 120 may be generally rectangular in shape instead of semi-ovular.

In some embodiments, there is a single second trace 112 electrically connected to the second contact pad 119. For example, and referring to FIG. 4, there is shown a semiconductor device package, generally designated 200, in accordance with another exemplary embodiment of the present disclosure. The semiconductor device package 200 may be generally the same as the semiconductor device package 100 as shown and described with reference to FIGS. 2-3, except that there may be a single second trace 212 that is electrically connected to each second contact pad 119. The second trace 212 may have a diameter that is greater than the diameter of a single first trace 110 included in the electrical circuit 108.

In some embodiments, there are two or more second contact pads coupled to a single second electrical contact. For example, and referring to FIG. 5, there is shown a semiconductor device package, generally designated 300, in accordance with another exemplary embodiment of the present disclosure. The semiconductor device package 300 may be generally the same as the semiconductor device package 100 as shown and described with reference to FIGS. 2-3, except that there may be two or more second contact pads 319 electrically connected to a single second electrical contact 120. In some embodiments, each of the second contact pads 319 has a pitch that is less than the pitch of the first contact pads 117 and/or the first electrical contacts 118. For example, the pitch of the first contact pads 117 may correspond to the pitch of the first electrical contacts 118 (e.g., may be generally the same). The pitch of the second contact pads 319 may be less than the pitch of the first contact pads 117 such that the common signals (e.g., power signals, ground signals) are clustered together more closely than the non-common signals (e.g., input/output signals). In some embodiments, there are between two to twelve second contact pads 319 each electrically connected to a single second contact 120. In some embodiments, each second contact 120 may substantially cover each of the second contact pads 319 corresponding to a common signal. For example, there may be one second contact pad 120 that covers each second contact pad 319 for routing power signals and another second contact pad 120 that covers each second contact pad 319 for routing ground signals.

In some embodiments, there are multiple second contact pads and multiple second electrical contacts. For example, and referring to FIGS. 6-7, there is shown a semiconductor device package, generally designated 400, in accordance with an exemplary embodiment of the present disclosure. The semiconductor device package 400 may be generally the same as the semiconductor device package 100 as shown and described with reference to FIGS. 2-3, except that there may be a plurality of second contact pads 419 and two or more second electrical contacts 420. In some embodiments, the pitch of the second contact pads 419 is less than the pitch of the first contact pads 117 and/or the pitch of the first electrical contacts 118. The second contact pads 419 may be configured to route common signals (e.g., power signals, ground signals) to the semiconductor device package 400. Each of the second electrical contacts 420 may substantially cover two or more of the second contact pads 419. For example, each of the second electrical contacts 420 may be electrically connected to between two to four second contact pads 419 such that each second electrical contact 420 covers multiple second contact pads 419.

In some embodiments, each second electrical contact 420 is comprised of a volume of material (e.g., solder material) that is at least twice the volume of material that a single first electrical contact 118 is comprised of. In some embodiments, there is a greater number of second contact pads 419 than second electrical contacts 420. For example, there may be eight second contact pads 419 and four second electrical contacts 420. In some embodiments, one or more second electrical contacts 420 is electrically connected to a different number of second contact pads 419 than one or more other second electrical contacts 420. For example, one second electrical contact 420 may be electrically connected to two second contact pads 419 and two second electrical contacts 420 may each be electrically connected to three second contact pads 419 respectively.

In some embodiments, the second electrical contacts 420 and second contact pads 419 for routing common signals are clustered together. For example, the second electrical contacts 420 for routing ground signals (illustrated as "G" in FIG. 7) may be clustered together and the second electrical contacts 420 for routing power signals (illustrated as "P" in FIG. 7) may be clustered together. As such, the second contact pads electrically connected to each of the power and ground second electrical contacts 420 may be clustered together. In some embodiments, one of the clusters of second electrical contacts 420 may be referred to as a first set of second electrical contacts and the other may be a second set of second electrical contacts. For example, the cluster of second electrical contacts 420 for routing power signals may be the first set of second electrical contacts and the cluster of second electrical contacts 420 for routing ground signals may be the second set, or vice versa. In some embodiments, the first and/or second sets of second electrical contacts may include two or more second electrical contacts 420.

In some embodiments, the second contact pads 419 may be smaller in size (e.g., lesser diameter, length, width) than the first contact pads 117. In other embodiments, the second contact pads 419 are generally the same size as the first contact pads 117. In some embodiments, by providing multiple second electrical contacts 420 the height of the second electrical contacts 420 may be generally the same as the height of the first electrical contacts 118 as the volume of material (e.g., solder material) for each of the first electrical contacts 118 increases. For example, as the volume of material for each of the first electrical contacts 118 increases the height of the first electrical contacts 118 may increase and it may be desired to provide second electrical contacts 420 having the same height as the first electrical contacts 118. As such, by providing multiple second electrical contacts 420, as opposed to a single second electrical contact (e.g., second electrical contact 120) for a given common signal (e.g., power signal, ground signal), the height of the second electrical contacts 420 may be generally the same as the height of the first electrical contacts 118.

Figure 8:
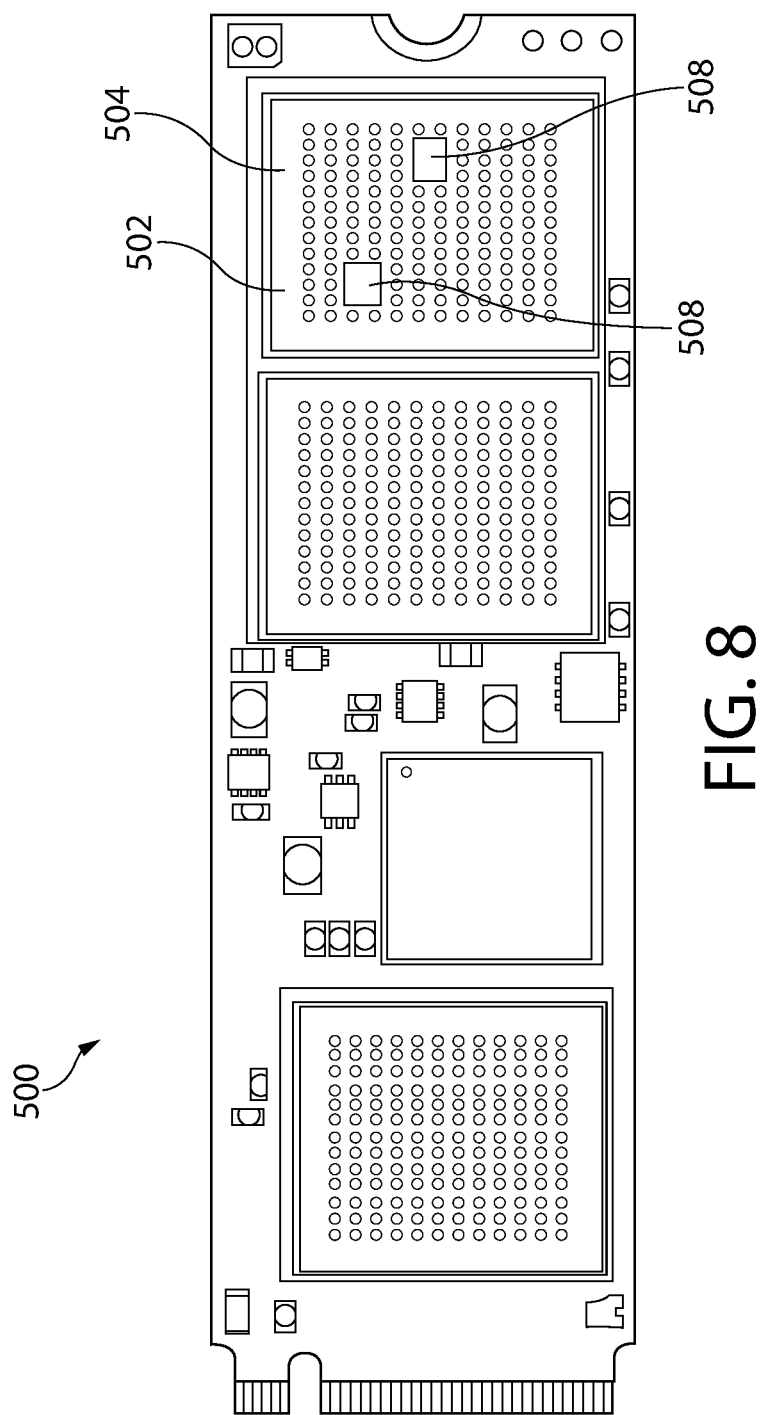
FIG. 8 is a top elevational view of a second substrate configured to receive any one of the semiconductor device packages shown in FIGS. 2-5.
Figure 9:
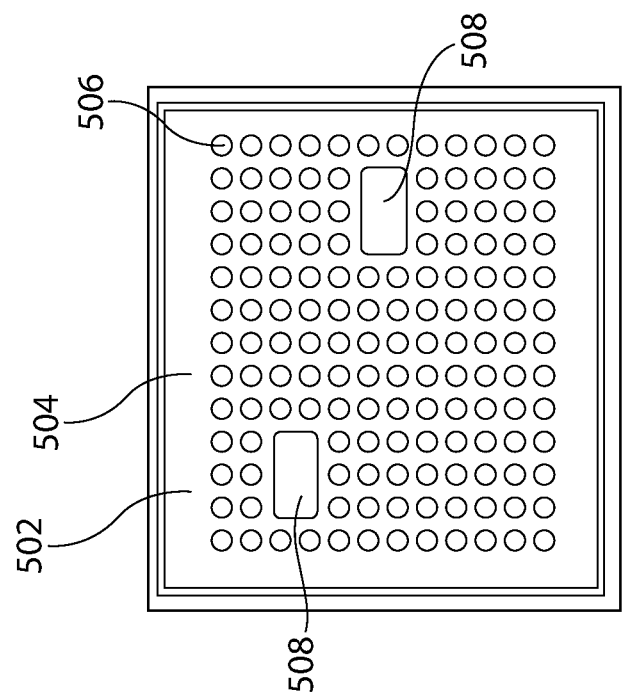
FIG. 9 is a magnified view of a receiving area on the second substrate.

In some embodiments, there may be an external device and/or substrate configured to receive any one of the semiconductor device packages as shown and described with reference to FIGS. 2-7. Referring to FIGS. 8-9 there is shown another semiconductor device package, generally designated 500, configured to receive any one of the semiconductor device packages 100, 200 and/or 300 as shown and described above with reference to FIGS. 2-5. The semiconductor device package 500 may include a second substrate 502 configured to receive any one of semiconductor device packages 100, 200 and/or 300. The second substrate 502 may include a top planar surface 504 having a plurality of contact pads coupled thereto. In some embodiments, there is a first plurality of contact pads 506 connected to the top planar surface 504 of the second substrate 502. The first plurality of contact pads 506 may be configured to electrically connect to the first plurality of electrical contacts 118 of any one of the semiconductor device packages 100, 200 and/or 300. In some embodiments, there are one or more second contact pads 508 connected to the top planar surface 504 of the second substrate 502. The one or more second contact pads 508 may be configured to electrically connect to the one or more second electrical contacts 120 of the first semiconductor device package 100. In this manner, the plurality of first contact pads 506 and the one or more second contact pads 508 may electrically and mechanically couple any one of the semiconductor device packages 100, 200 and/or 300 to the second semiconductor device package 500.

In some embodiments, each second contact pad 508 has a surface area that is greater than the surface area of each first contact pad 506. In some embodiments, the size of each second contact pad 508 is dependent upon the size of each second electrical contact 120. In some embodiments, each second contact pad 508 is comprised of a volume of material that is greater than the volume of material that each first contact pad 506 is comprised of. Although not shown, semiconductor device package 500 may be configured to receive any number of, and any combination of semiconductor device package 100, 200 and/or 300. For example, in FIG. 8, the second semiconductor device package 500 is illustrated as being capable of connecting to a single semiconductor device package 100, 200 or 300. However, the second semiconductor device package 500 may include any number of connection areas generally the same as the connection area illustrated in FIG. 9 having the first and second contact pads 506, 508.

Figure 10:
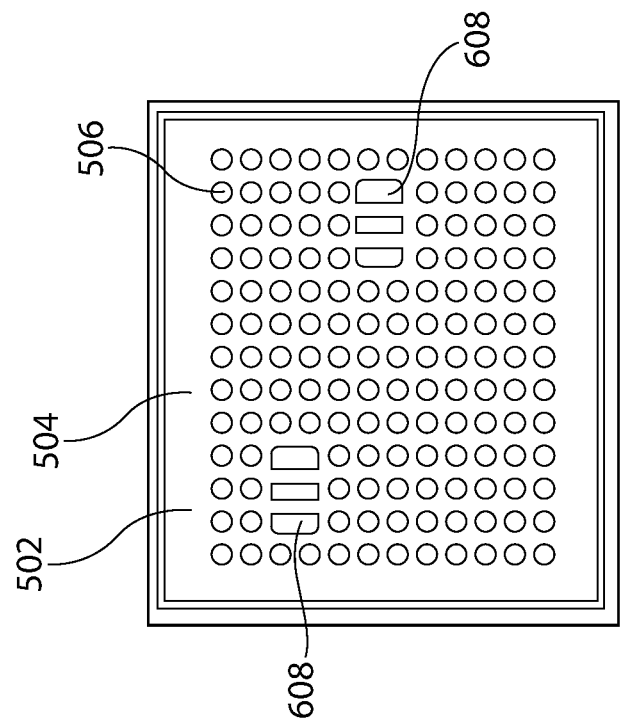
FIG. 10 is a magnified view of a receiving area on the second substrate configured to receive the semiconductor device package of FIGS. 6-7.

Referring to FIG. 10, in some embodiments, the second semiconductor device package 500 may be configured to couple to the semiconductor device package 400, shown and described above with reference to FIGS. 6-7. In FIG. 10, the connection area of the second substrate 502 includes the plurality of first contact pads 506 corresponding to the plurality of first electrical contacts 118 and one or more second contact pads 608 corresponding to the second electrical contacts 420. For example, the second contact pads 608 are clustered together in sets of three contact pads per cluster and there are two clusters each corresponding to a different common signal (e.g., power signal, ground signal). The second contact pads 608 may electrically connect to the second electrical contacts 420 and the plurality of first contact pads 506 may electrically connect to the first plurality of electrical contacts 118. In this manner, the second semiconductor device package 500 may be electrically connected to the semiconductor device package 400 via the first and second contact pads 506, 608. It will be understood that the semiconductor device package 500 may include any combination of the connection areas illustrated in FIGS. 9-10 such that any combination of semiconductor device packages 100, 200, 300 and/or 400 may be electrically connected thereto.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor device package, comprising:
   a substrate including a top surface, a bottom surface and an electrical circuit;
   a semiconductor die coupled to the top surface of the substrate and electrically coupled to the electrical circuit;
   N adjacent first electrical contacts coupled to the bottom surface of the substrate and electrically coupled to the electrical circuit, wherein N is an integer greater than 1, the N adjacent electrical contacts positioned within a first contact area on the bottom surface of the substrate;
   a second electrical contact coupled to the bottom surface of the substrate and electrically coupled to the electrical circuit, wherein the second electrical contact is associated with N independent common signals that are electrically connected at a single second electrical contact, the second electrical contact positioned within a second contact area on the bottom surface of the substrate that is smaller than the first contact area;
   one or more first contact pads electrically connecting the N adjacent first electrical contacts to the electrical circuit of the substrate; and
   one or more second contact pads electrically connecting the second electrical contact to the electrical circuit of the substrate,
   wherein the electrical circuit includes at least one first trace electrically connected to each of the one or more first contact pads, and at least one second trace electrically connected to each contact pad of the one or more second contact pads.

2. The semiconductor device package of claim 1, further comprising:
   a third electrical contact coupled to the bottom surface of the substrate and electrically coupled to the electrical circuit, wherein the third electrical contact is associated with an electrical signal independent and distinct from any of the electrical signals of the N adjacent first electrical contacts and the N independent common signals of the second electrical contact, the second electrical contact and the third electrical contact positioned within a third contact area on the bottom surface of the substrate that is less than the first contact area.

3. The semiconductor device package of claim 2, further comprising:
   a fourth electrical contact coupled to the bottom surface of the substrate and electrically coupled to the electrical circuit, wherein the fourth electrical contact is associated with an electrical signal independent and distinct from any of the electrical signals of the N adjacent electrical contacts, the N independent common signals of the second electrical contact, and the electrical signal of the third electrical contact, wherein the second electrical contact, the third electrical contact, and the fourth electrical contact are positioned within a fourth contact area on the bottom surface of the substrate that is less than the first contact area.

4. The semiconductor device package of claim 1, wherein the second electrical contact is one of a power contact and ground contact, and
   wherein the N adjacent first electrical contacts are each input/output contacts configured to transmit electrical signals to and from the semiconductor die.

5. The semiconductor device package of claim 1, wherein the one or more second contact pads includes one of a power contact pad configured to provide power to the semiconductor die and a ground contact pad in electrical communication with the semiconductor die.

6. The semiconductor device package of claim 1, wherein the second electrical contact has a height that is equal to a height of the electrical contacts included in the N adjacent first electrical contacts.

7. The semiconductor device package of claim 1, wherein the N adjacent first electrical contacts is N adjacent solder balls each comprised of a first volume of solder material, and wherein the second electrical contact is comprised of a second volume of solder material that is greater than the first volume of solder material.

8. The semiconductor device package of claim 7, wherein the second volume of solder material is at least twice the first volume of solder material.

9. A semiconductor device package, comprising:
   a substrate means for providing electrical communication to one or more electrical components coupled to the substrate means;
   one or more storage means for providing a first storage amount and connected to a top surface of the substrate means;
   N adjacent first electrical contact means each for transmitting to and receiving from the one or more storage means a plurality of electrical signals, where N is an integer greater than 1 and the N adjacent first electrical contact means are connected to a bottom surface of the substrate means, the N adjacent first electrical contact means are positioned within a first contact area on the bottom surface of the substrate means;
   a second electrical contact means for transmitting to and receiving from the one or more storage means a second signal, wherein the second signal is associated with N independent common signals electrically connected at a single second electrical contact means, the second electrical contact means connected to the bottom surface of the substrate means, the second electrical contact means positioned within a second contact area on the bottom surface of the substrate means that is smaller than the first contact area; and a third electrical contact means for transmitting to and receiving from the one or more storage means a third signal, the third electrical contact means coupled to the bottom surface of the substrate means, wherein the third signal is independent and distinct from any of the electrical signals of the N adjacent first electrical contact means and the N independent common signals of the second electrical contact means, the second electrical contact means and the third electrical contact means positioned within a third contact area on the bottom surface of the substrate means that is smaller than the first contact area.

10. The semiconductor device package of claim 9, wherein each electrical contact means of the N adjacent first electrical contact means includes a first volume of solder material, and wherein the second electrical contact means includes a second volume of solder material that is at least twice the first volume of solder material.

11. The semiconductor device package of claim 9, wherein the second electrical contact means has a height that is equal to the height of the electrical contact means included in the N adjacent first electrical contact means.

12. The semiconductor device package of claim 9, wherein the second electrical contact means is one of a power contact means and a ground contact means, and
wherein the N adjacent first contact means are each input/output contact means for transmitting input/output signals to and from the one or more storage means.

13. A semiconductor device package, comprising:
a substrate including a top surface, a bottom surface and an electrical circuit;
a semiconductor die coupled to the top surface of the substrate and electrically coupled to the electrical circuit;
N adjacent first electrical contacts coupled to the bottom surface of the substrate and electrically coupled to the electrical circuit, wherein N is an integer greater than 1, the N adjacent electrical contacts positioned within a first contact area on the bottom surface of the substrate;
a second electrical contact coupled to the bottom surface of the substrate and electrically coupled to the electrical circuit, wherein the second electrical contact is associated with N independent common signals that are electrically connected at a single second electrical contact, the second electrical contact positioned within a second contact area on the bottom surface of the substrate that is smaller than the first contact area;
a third electrical contact coupled to the bottom surface of the substrate and electrically coupled to the electrical circuit, wherein the third electrical contact is associated with an electrical signal independent and distinct from any of the electrical signals of the N adjacent first electrical contacts and the N independent common signals of the second electrical contact, the second electrical contact and the third electrical contact positioned within a third contact area on the bottom surface of the substrate that is less than the first contact area; and
a fourth electrical contact coupled to the bottom surface of the substrate and electrically coupled to the electrical circuit, wherein the fourth electrical contact is associated with an electrical signal independent and distinct from any of the electrical signals of the N adjacent electrical contacts, the N independent common signals of the second electrical contact, and the electrical signal of the third electrical contact, wherein the second electrical contact, the third electrical contact, and the fourth electrical contact are positioned within a fourth contact area on the bottom surface of the substrate that is less than the first contact area.

14. The semiconductor device package of claim 13, wherein the second electrical contact is one of a power contact and ground contact, and
wherein the N adjacent first electrical contacts are each input/output contacts configured to transmit electrical signals to and from the semiconductor die.

15. The semiconductor device package of claim 13, further comprising:
one or more first contact pads electrically connecting the N adjacent first electrical contacts to the electrical circuit of the substrate; and
one or more second contact pads electrically connecting the second electrical contact to the electrical circuit of the substrate,
wherein the electrical circuit includes at least one first trace electrically connected to each of the one or more first contact pads, and at least one second trace electrically connected to each contact pad of the one or more second contact pads, and
wherein the one or more second contact pads includes one of a power contact pad configured to provide power to the semiconductor die and a ground contact pad in electrical communication with the semiconductor die.

16. The semiconductor device package of claim 13, wherein the second electrical contact has a height that is equal to a height of the electrical contacts included in the N adjacent first electrical contacts.

17. The semiconductor device package of claim 13, wherein the N adjacent first electrical contacts is N adjacent solder balls each comprised of a first volume of solder material, and wherein the second electrical contact is comprised of a second volume of solder material that is greater than the first volume of solder material.

18. The semiconductor device package of claim 17, wherein the second volume of solder material is at least twice the first volume of solder material.

* * * * *